(12) United States Patent
Chen et al.

(10) Patent No.: US 12,482,759 B2
(45) Date of Patent: Nov. 25, 2025

(54) WAFER-LEVEL ASIC 3D INTEGRATED SUBSTRATE, PACKAGING DEVICE AND PREPARATION METHOD

(71) Applicant: SJ Semiconductor(Jiangyin) Corporation, Jiangyin (CN)

(72) Inventors: Yenheng Chen, Jiangyin (CN); Chengchung Lin, Jiangyin (CN); Jangshen Lin, Jiangyin (CN); Mingchih Chen, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 753 days.

(21) Appl. No.: 17/851,752

(22) Filed: Jun. 28, 2022

(65) Prior Publication Data
US 2022/0415816 A1 Dec. 29, 2022

(30) Foreign Application Priority Data

Jun. 28, 2021 (CN) .......................... 202110721425.1
Jun. 28, 2021 (CN) .......................... 202121466583.9

(51) Int. Cl.
| | |
|---|---|
| *H01L 23/31* | (2006.01) |
| *H01L 23/00* | (2006.01) |
| *H01L 23/498* | (2006.01) |
| *H01L 23/538* | (2006.01) |
| *H01L 25/065* | (2023.01) |

(52) U.S. Cl.
CPC ...... *H01L 23/5389* (2013.01); *H01L 23/3128* (2013.01); *H01L 23/49816* (2013.01); *H01L 23/49827* (2013.01); *H01L 24/16* (2013.01); *H01L 25/0655* (2013.01); *H01L 2224/12105* (2013.01); *H01L 2924/15311* (2013.01)

(58) Field of Classification Search
CPC ........... H01L 23/3128; H01L 23/49816; H01L 23/49827; H01L 24/16; H01L 25/0655
See application file for complete search history.

(56) References Cited

U.S. PATENT DOCUMENTS

2022/0415816 A1* 12/2022 Chen ....................... H01L 24/16

\* cited by examiner

*Primary Examiner* — Mark V Prenty
(74) *Attorney, Agent, or Firm* — IPRTOP LLC (57) ABSTRACT

The present disclosure provides a wafer-level ASIC 3D integrated substrate, a packaging device and a preparation method. The substrate includes a first wiring layer, conductive pillars, a molding layer, a second wiring layer and solder balls. The first wiring layer includes a first dielectric layer and a first metal wire layer, the first metal wire layer is exposed from a top surface of the first dielectric layer. The second wiring layer includes a second dielectric layer and a second metal wire layer. The conductive pillars are disposed between the first wiring layer and the second wiring layer, two ends of each conductive pillar are electrically connected to the first metal wire layer and the second metal wire layer, respectively. The molding layer molds the conductive pillars. The solder balls are disposed on a side of the second wiring layer and electrically connected to the second metal wire layer.

5 Claims, 5 Drawing Sheets

WAFER-LEVEL ASIC 3D INTEGRATED SUBSTRATE, PACKAGING DEVICE AND PREPARATION METHOD

CROSS REFERENCE TO RELATED APPLICATION

The present application claims the benefit of priority to Chinese Patent Application No. CN 202110721425.1, entitled "Wafer-Level ASIC 3D Integrated Substrate, Packaging Device and Preparation Method", filed with CNIPA on Jun. 28, 2021, and Chinese Patent Application No. CN 202121466583.9, entitled "Wafer-Level ASIC 3D Integrated Substrate and Packaging Device", filed with CNIPA on Jun. 28, 2021, the contents of which are incorporated herein by reference in their entireties.

FIELD OF THE TECHNOLOGY

The present disclosure relates to the technical field of semiconductor manufacturing, in particular to the field of back-end packaging, and in particular to a wafer-level Application Specific Integrated Circuit (ASIC) Three-Dimensional (3D) integrated substrate, a packaging device and a preparation method.

BACKGROUND

A Printed Circuit Board (PCB) is the support body of electronic components and the carrier of electrical connection, and is one of the commonly used packaging substrates.

Traditional PCB boards used in batches mostly have 1 to 12 layers, the more I/O interfaces a chip needs, the more layers the PCB board requires, the price will be then higher. Traditional substrate process of a PCB has certain limits. For example, the minimum line width and line spacing of the current PCB substrate are more than 50 μm, the minimum line width and line spacing of Ball Grid Array (BGA) Integrated Circuit (IC) carrier board are 30 μm, even the most advanced process of Fine-Pitch Ball Grid Array (FBGA) IC carrier board can only achieve the minimum line width and line spacing of 20 μm. With the increasing functional integration of front-end chips, the existing packaging substrate technology will not be able to meet the demand of the front-end chips, so the advanced 2.5D & fan out wafer level packaging technology is needed, but this technology has disadvantages such as high cost and long production time compared to the traditional substrate manufacturing technology, and this advanced packaging technology is only suitable for packaging wafers after the completion of the front-end process and cannot be pre-customized, which may cause chip damage during the packaging process.

SUMMARY

The present disclosure provides a wafer-level ASIC 3D integrated substrate, a packaging device, and a preparation method, to solve the problems that PCB substrate packaging technology has process limits, line widths cannot be further reduced, the requirements of increasing integration of electronic devices cannot be met, fan-out wafer-level packaging and other packaging technology has high cost and long production time, and chip damage may be caused in the process of packaging.

A method for preparing a plurality of wafer-level ASIC 3D integrated substrates includes: providing a carrier; forming a separation layer on the carrier; forming a first wiring layer on the separation layer, the first wiring layer includes a first dielectric layer and a first metal wire layer, the first metal wire layer is exposed from a top surface of the first dielectric layer; forming a conductive pillar on the first wiring layer, the conductive pillar is electrically connected to the first metal wire layer; forming a molding layer, the molding layer molds the conductive pillar, and the conductive pillar is exposed from a top surface of the molding layer; forming a second wiring layer on the molding layer, the second wiring layer includes a second dielectric layer and a second metal wire layer, the second metal wire layer is exposed from a top surface of the second dielectric layer, and the second metal wire layer is electrically connected to the conductive pillar; forming solder balls on the second wiring layer, the solder balls are electrically connected to the second metal wire layer; and peeling off the carrier at the separation layer to expose a surface of the first wiring layer away from the conductive pillar.

Optionally, a thickness of the first wiring layer and a thickness of the second wiring layer each ranges from 15 μm to 40 μm, and a thickness of the molding layer ranges from 50 μm to 100 μm.

Optionally, a material of the carrier includes glass, and a material of the conductive pillar includes copper.

Optionally, the method further includes: forming an Organic Solderability Preservatives (OSP) antioxidant layer on the surface of the first wiring layer away from the conductive pillar before peeling off the carrier, the OSP antioxidant layer covers a surface of the first metal wire layer.

Optionally, the method further includes: separating the wafer-level ASIC 3D integrated substrates from each other by dicing after forming the OSP antioxidant layer.

The present disclosure further provides a wafer-level ASIC 3D integrated substrate. The substrate includes a first wiring layer, a second wiring layer, a plurality of conductive pillars, a molding layer, and solder balls.

The first wiring layer includes a first dielectric layer and a first metal wire layer, and the first metal wire layer is exposed from a top surface of the first dielectric layer. The second wiring layer includes a second dielectric layer and a second metal wire layer, and the second metal wire layer is exposed from a top surface of the second dielectric layer. The plurality of conductive pillars is disposed between the first wiring layer and the second wiring layer, and two ends of each of the plurality of conductive pillars are electrically connected to the first metal wire layer and the second metal wire layer, respectively. The molding layer molds the plurality of conductive pillars. The solder balls are disposed on a side of the second wiring layer away from the plurality of conductive pillars and electrically connected to the second metal wire layer.

Optionally, the wafer-level ASIC 3D integrated substrate further includes an OSP antioxidant layer disposed on a surface of the first wiring layer away from the plurality of conductive pillars, the OSP antioxidant layer covers a surface of the first metal wire layer.

The present disclosure further provides a packaging device. The packaging device includes a packaging chip and the above wafer-level ASIC 3D integrated substrate. The packaging chip is disposed on a surface of the wafer-level ASIC 3D integrated substrate and is electrically connected to the wafer-level ASIC 3D integrated substrate.

Optionally, the packaging chip includes an active device and a passive device. The active device is disposed on a surface of the first wiring layer away from the molding layer and is electrically connected to the first wiring layer. The passive device is disposed on a surface of the second wiring layer away from the molding layer and is electrically connected to the second wiring layer.

Optionally, the active device includes one or more of a logic Integrated Circuit (IC), a High Bandwidth Memory (HBM), a switch, a Power Management Unit (PMU), and a Surface Mounted device (SMD).

As mentioned above, the wafer-level ASIC 3D integrated substrate, the packaging device and the preparation method of the present disclosure have the following beneficial effects: the minimum line width and line spacing of the wafer-level ASIC 3D integrated substrate of the present disclosure can be reduced to 1.5 μm, which is much smaller than 20 μm of that of the conventional substrate, thus enabling high-density and high-integration packaging of the device. The thickness of the substrate can be less than 0.2 mm (the thickness of the traditional FBGA 10-layer board is 1 mm), which helps to further reduce size of the packaging device. The time for fabricating the substrate is short, which can realize scale customization and help to reduce the package cost. The substrate does not need to be packaged with chips, which can reduce the risk of chip damage and help to improve the packaging yield. By using the wafer-level ASIC 3D integrated substrate of the present disclosure for packaging, various electronic chips and components such as millimeter wave antenna, capacitor, inductor, electric crystal switch, GPU, PMU, DDR, flash memory and filter can be integrated to realize system-level packaging. The packaging device packaged based on the wafer-level ASIC 3D integrated substrate of the present disclosure can not only reduce the cost, but also eliminate the parasitic capacitance of the substrate and reduce the device noise; meanwhile, it can improve the power efficiency and increase the device response efficiency and reliability; the requirement for the design margin of the device is low, which makes the packaging device of the present disclosure more widely applicable.

DESCRIPTION OF THE REFERENCE NUMERALS

11 Carrier
12 Separation layer
13 First wiring layer
131 First dielectric layer
132 First metal wire layer
14 Conductive pillar
15 Molding layer
16 Second wiring layer
161 Second dielectric layer
162 Second metal wire layer
17 Solder ball
18 OSP antioxidant layer
191 Active device
192 Passive device
20 Bump
21 Stage

DESCRIPTION OF THE EMBODIMENTS

The implementation mode of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. When describing the embodiments of the present disclosure in detail, for the convenience of description, the cross-sectional views showing the device structure will not be partially enlarged according to the general scale, and the schematic diagrams are only embodiments, which should not limit the protection scope of the present disclosure. In addition, the three-dimensional spatial dimensions of length, width and depth should be included in the actual production.

For convenience of description, spatially relative terms such as "under," "below," "lower," "down," "above," "on," etc. may be used herein to describe the relationship of an element or a feature to other components or features shown in the drawings. It will be understood that these spatially relative terms are intended to encompass other directions of the device in use or operation than those depicted in the drawings. In addition, when a layer is referred to as being 'between' two layers, it can be the only layer between the two layers, or one or more intervening layers between the two layers.

In some embodiments of the present disclosure, when a first feature is "on" a second feature, the first feature and the second feature may be formed in direct contact, or additional features may be formed between the first feature and the second feature, in this way, the first feature and the second feature may not be in direct contact.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated. In order to make the illustrations as concise as possible, not all structures are shown in the attached drawings.

The present disclosure provides a method for preparing a wafer-level ASIC 3D integrated substrate.

Figure 1:
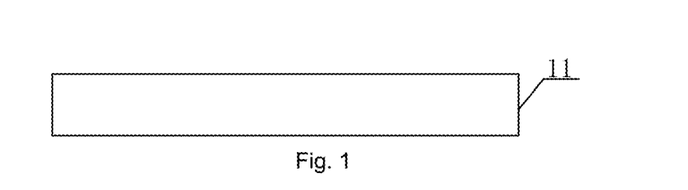
FIGS. 1-11 show schematic cross-sectional views of the structures after each step of the manufacturing process of a wafer-level ASIC 3D integrated substrate according to the present disclosure.
Figure 2:
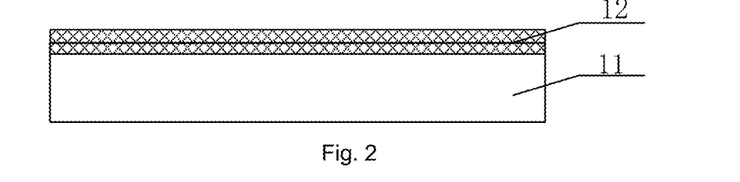

Refer to FIG. 1, a carrier 11 is provided, and a separation layer 12 is formed on the carrier 11, the obtained structure is shown in FIG. 2.

Figure 3:
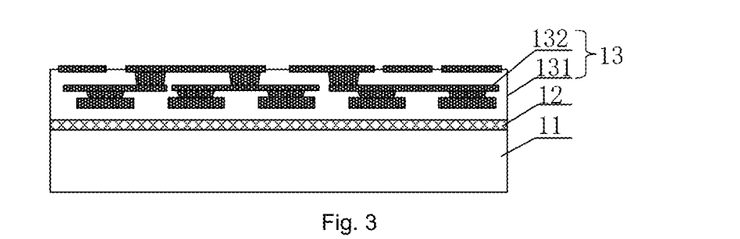

A first wiring layer 13 is formed on the separation layer 12. The first wiring layer 13 may also be called a frontal wiring layer, since the first wiring layer 13 will be used for frontal mounting with the chip in subsequent device packaging. The first wiring layer 13 includes a first dielectric layer 131 and a first metal wire layer 132. The first metal wire layer 132 is exposed on a surface of the first dielectric layer 131, and the obtained structure is shown in FIG. 3.

Figure 4:
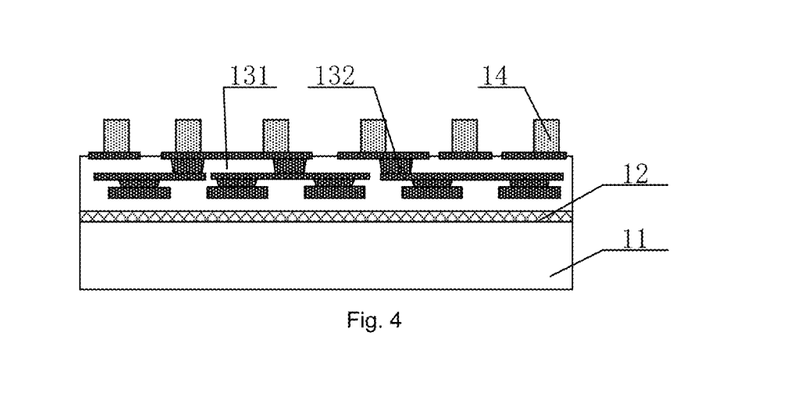

A number of conductive pillars 14 are formed on the first wiring layer 13. Take one conductive pillar 14 as an example, it includes, but not limited to, a copper pillar. The conductive pillar 14 is electrically connected to the first metal wire layer 132, the obtained structure is shown in FIG. 4. In an embodiment, a method for forming the conductive pillar 14 may include: forming a metal seed layer using a process including, but not limited to, a vapor deposition process; forming a metal layer on a surface of the metal seed layer using a deposition process including, but not limited to, one or more of sputtering, electroplating, chemical plating, etc. such as a copper electroplating process, of course the metal seed layer will be copper if it is a copper electroplating process; and photolithographic etching the formed electroplated copper layer and the metal copper seed layer to form a plurality of conductive copper pillars 14 spaced at an interval from each other.

Figure 5:
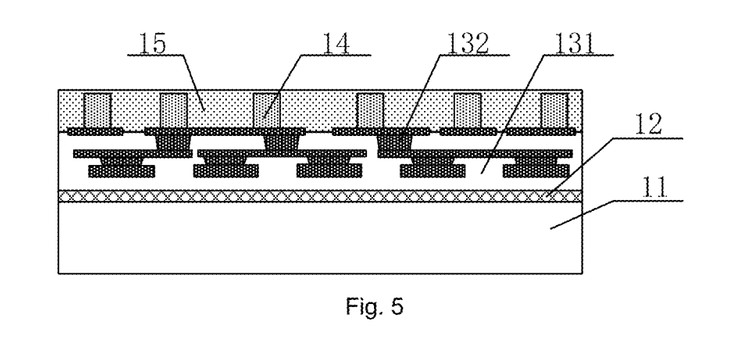
Figure 6:
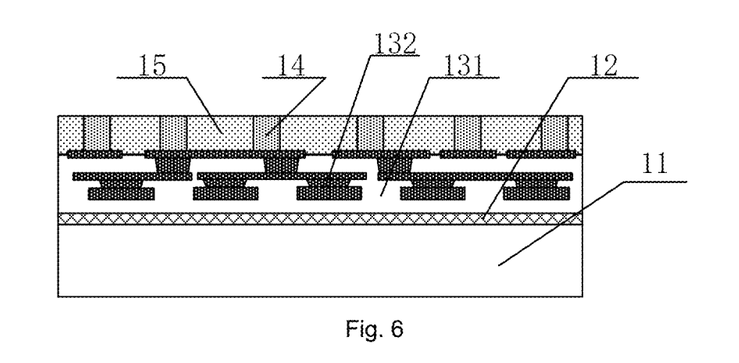

A molding layer 15 is formed, the molding layer 15 molds the conductive pillar 14, and the conductive pillars 14 is exposed on a surface of the molding layer 15. Specifically, the molding layer 15 molding the conductive pillars 14 may be formed by a method including but not limited to one or more of compression molding, transfer molding, liquid packaging molding, vacuum lamination and spin coating, and the obtained structure is shown in FIG. 5. The obtained structure is then planarized by a method including but not limited to grinding, so that top surfaces of the conductive pillars 14 are flush with a top surface of the molding layer 15, to obtain the structure shown in FIG. 6. The material of the molding layer 15 includes, but not limited to, one or more of polyimide, silicone, and epoxy resin. In other examples, the molding layer 15 may be formed, then openings are formed in the molding layer 15, and the openings are filled with metal material to form the conductive pillars 14. However, forming the conductive pillars 14 first and then molding ensures electrical connection between the conductive pillars 14 and the first wiring layer 13 and reduces alignment difficulties.

Figure 7:
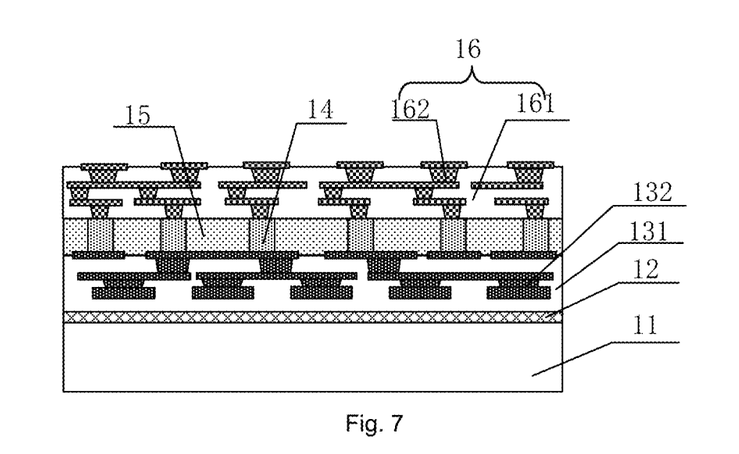

A second wiring layer 16 (also called back wiring layer or reverse wiring layer) is formed on the molding layer 15. The second wiring layer 16 includes a second dielectric layer 161 and a second metal wire layer 162. The second metal wire layer 162 is exposed on a surface of the second dielectric layer 161, and the second metal wire layer 162 is electrically connected to the conductive pillars 14, the obtained structure is shown in FIG. 7. In other examples, conductive pillars and wiring layers may continue to be formed on the second wiring layer as needed to form a stack of three or more wiring layers.

Figure 8:
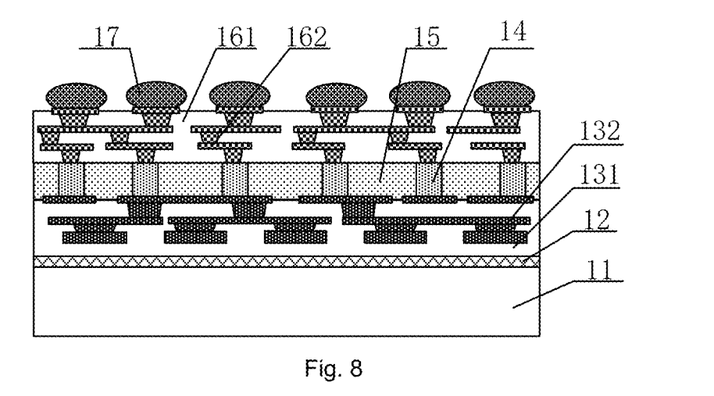

Solder balls 17 are formed on the second wiring layer 16, the solder balls 17 are electrically connected to the second metal wire layer 162, the obtained structure is shown in FIG. 8. For example, openings may be formed in the second wiring layer 16 to expose the second metal wire layer 162, and then solder balls 17 may be formed inside the corresponding openings using a ball mount method, which helps to ensure good electrical contact between the solder balls 17 and the second metal wire layer 162. The material of the solder balls 17 includes, but is not limited to, tin, gold, copper or an alloy of tin and copper.

Figure 9:
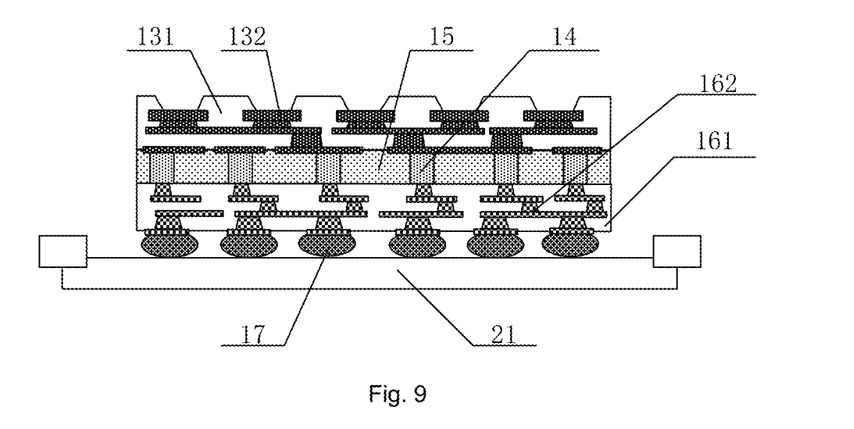
Figure 10:
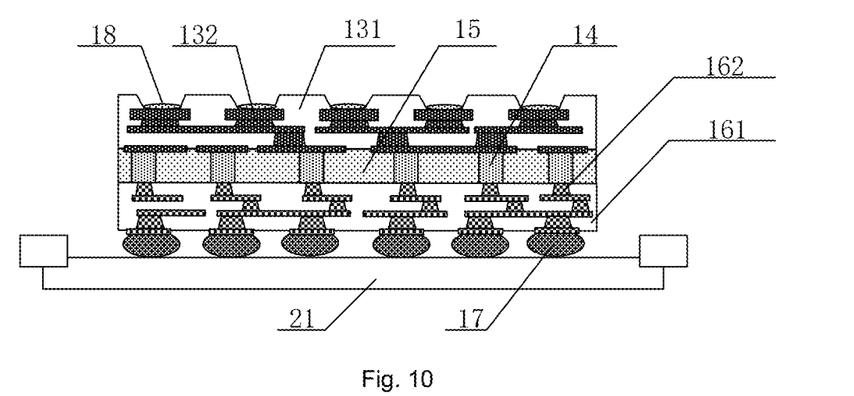
Figure 11:
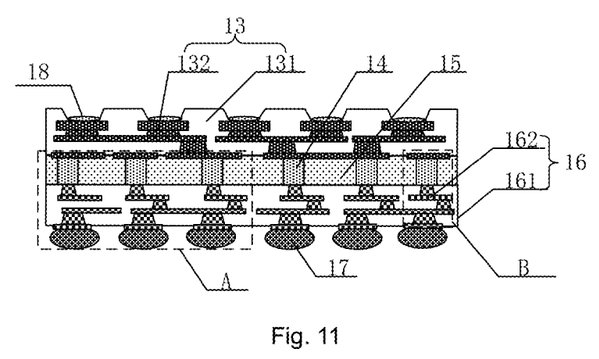
Figure 12:
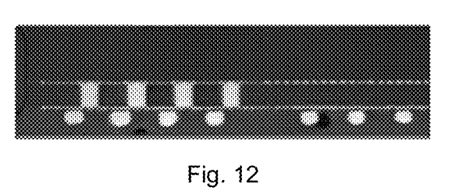
FIG. 12 shows an enlarged SEM image of area A of the wafer-level ASIC 3D integrated substrate of FIG. 11.
Figure 13:
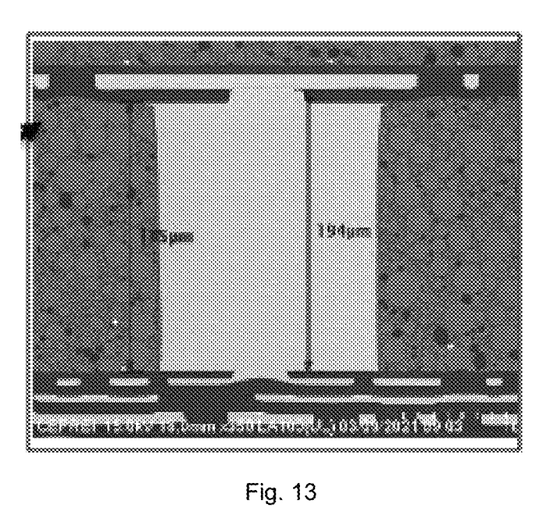
FIG. 13 shows an enlarged SEM image of area B of the wafer-level ASIC 3D integrated substrate of FIG. 11.

After forming the solder balls 17, the carrier 11 is peeled off from the separation layer 12 to expose a surface of the first wiring layer 13 away from the conductive pillars 14, and the first metal wire layer 132 is exposed on the surface of the first wiring layer 13. For example, the structure obtained in the preceding steps may be placed upside down (i.e., solder balls 17 facing down) on a carrier 21, and the carrier 11 may be peeled off depending on the material of the separation layer 12. For example, when the separation layer 12 is a UV resin layer, the separation layer 12 may be irradiated using UV light, thereby peeling off the carrier 11. The obtained structure after this step is shown in FIG. 9. To avoid oxidation of the exposed metal wire layer in air, in one example, an OSP antioxidant layer 18 may be formed on the surface of the first wiring layer 13 away from the conductive pillars 14 before peeling off the carrier 11, referring to FIG. 12 for the SEM image of area A in FIG. 11, and referring to FIG. 13 for the SEM image of area B in FIG. 11. The OSP antioxidant layer 18 covers the surface of the first metal wire layer 132, and the obtained structure obtained is shown in FIG. 10. After peeling off the carrier 11, the obtained structure is shown in FIG. 11. The OSP antioxidant layer is an organic solder preservation film, also known as a copper protector. The OSP antioxidant layer is prepared by a process in which an organic skin layer is chemically grown on a clean surface of the first metal wire layer 132 (e.g., a copper layer). The OSP antioxidant layer 18 is resistant to oxidation, thermal shock and humidity, which prevents the surface of the first metal wire layer 132 exposed to air from rusting (oxidation or sulfidation, etc.), but in the subsequent high soldering temperature, the OSP antioxidant layer 18 can be easily and quickly removed by the flux, thus the surface of the exposed first metal wire layer 132 may be bonded to the molten solder balls 17 in a very short period of time to form solid solder joints.

The wafer-level ASIC 3D integrated substrate of the present disclosure is manufactured by a semiconductor front-end manufacturing process, so both the minimum line width and line spacing of the substrate can be 1.5 μm, and the overall thickness of the substrate can be less than 0.2 mm, which can achieve high-density and high-integration packaging when used for device packaging, and is conducive to the further reduction of device packaging size. The preparation process of the substrate is simple and can be customized on a large scale, which helps to shorten the process time and reduce the packaging cost, and the preparation process of the substrate does not require chip intervention, which reduces the risk of chip damage and helps to improve the packaging yield.

As an embodiment, a process for forming the first wiring layer 13 includes: forming a first dielectric layer 131 on the separation layer 12 using a process including but not limited to a vapor deposition process; forming an opening in the first dielectric layer 131 corresponding to the first metal wire layer 132 using a photolithography etching process; forming a first metal material layer within the opening and on a surface of the first dielectric layer 131 to form the first metal wire layer 132 using a method including but not limited to one or more of sputtering, electroplating, chemical plating, etc. The material of the first dielectric layer 131 includes, but is not limited to, one or more of epoxy resin, silicone, PI, PBO, BCB, silicon oxide, phosphor silica glass, fluorine containing glass, and may also be other high K dielectric materials. The material of the first metal wire layer 132 includes, but is not limited to, one or more of gold, silver, copper, aluminum, and other metals, and is preferably copper layer. The first dielectric layer 131 and the first metal wire layer 132 may both have single or multi-layer structures. When the first metal wire layer 131 has multi-layer structures, the first metal wire layers 132 of different layers are electrically connected to each other. The material and preparation process of the second wiring layer 16 can be the same as the material and preparation process of the first wiring layer 13, which will not be described in detail.

As an example, the thickness of the first wiring layer 13 and the thickness of the second wiring layer 16 range from 15 μm to 40 μm, and the thickness of the first wiring layer 13 and the thickness of the second wiring layer 16 can be the same or different, depending on the need. The specific structure of the first wiring layer 13 and the second wiring layer 16 can be flexibly adjusted according to the number/type of chips to be packaged, making the integrated substrate of the present disclosure suitable for use in a variety of packaging structures.

In an example, the thickness of the molding layer 15 ranges from 50 μm to 100 μm. By forming the conductive pillars 14 and the molding layer 15 molding the conductive pillars 14, the height of the entire substrate can be increased, which helps to further reduce the stress on the substrate and facilitates subsequent device packaging.

The carrier 11 mainly plays a supporting role to avoid undesirable bending and deformation during device preparation. As an example, the carrier 11 includes but is not limited to glass, silicon substrate, sapphire substrate, ceramic substrate, metal substrate and other substrates with a certain degree of hardness and not prone to bending deformation. A transparent substrate such as a glass substrate is preferred in this example, which helps peeling the carrier 11 from the separation layer 12. For example, the back side of the carrier 11 is irradiated with UV light to peel the carrier 11 from the separation layer 12. Before preparing the separation layer 12, the carrier 11 may be cleaned and dried.

The release layer 12 may have a single-layer or multi-layer structure, and may include a release layer and a protective layer disposed on a surface of the release layer. Specifically, the release layer includes, but is not limited to, one or more of a carbon material layer, a resin material layer, and an organic material layer, and the protective layer includes, but is not limited to, a polyimide layer. For example, if the carrier 11 is a transparent substrate such as glass and the release layer 12 is a UV resin layer, the release layer 12 may be irradiated from the back side of the carrier 11 to peel the carrier 11 from the release layer 12. The separation layer 12 may also be a Light to Heat Conversion (LTHC) layer, and the LTHC layer may be heated using laser and other methods in the subsequent steps to separate the carrier 11 from the LTHC layer, thereby reducing the process difficulty of peeling and preventing device damage. A method for forming the separation layer 12 may depend on the material of the separation layer 12, and the method may include one or more of spin coating, spraying, direct attachment, etc.

The preparation method of the present disclosure may prepare a single wafer-level ASIC 3D integrated substrate or multiple substrates, and when multiple wafer-level ASIC 3D integrated substrates are prepared, the preparation method further includes: after forming the OSP antioxidant layer 18, separating the wafer-level ASIC 3D integrated substrates from each other by dicing. The dicing may also be performed after attaching the chip onto a surface of the substrate.

The present disclosure further provides a wafer-level ASIC 3D integrated substrate, which can be prepared based on any of the aforementioned preparation methods, so the foregoing may be incorporated herein by reference in its entirety. Specifically, as shown in FIG. 11, the wafer-level ASIC 3D integrated substrate includes a first wiring layer 13, a conductive pillar 14, a molding layer 15, a second wiring layer 16, and solder balls 17. The first wiring layer 13 includes a first dielectric layer 131 and a first metal wire layer 132, the first metal wire layer 132 is exposed on a surface of the first dielectric layer 131. The second wiring layer 16 includes a second dielectric layer 161 and a second metal wire layer 162, the second metal wire layer 162 is exposed on a surface of the second dielectric layer 161. The conductive pillar 14 is disposed between the first wiring layer 13 and the second wiring layer 16, and two ends of the conductive pillar 14 are electrically connected to the first metal wire layer 132 and the second metal wire layer 162 respectively. The molding layer 15 molds the conductive pillar 14. The solder balls 17 are disposed on a side of the second wiring layer 16 away from the conductive pillars 14 and is electrically connected to the second metal wire layer 162.

In an example, the wafer-level ASIC 3D integrated substrate further includes an OSP antioxidant layer 18. The OSP antioxidant layer 18 is disposed on a surface of the first wiring layer 13 away from the conductive pillar 14 and covers a surface of the first metal wire layer 132.

For more description of the wafer-level ASIC 3D integrated substrate, please refer to the preceding examples, which will not be repeated. The wafer-level ASIC 3D integrated substrate of the present disclosure can be used in both 2.5D packages and 3D packages, and its entirety acts as a silicon interposer that can simultaneously integrate various electronic chips and components such as millimeter wave antennas, capacitors, inductors, electric crystal switches, GPUs, PMUs, DDRs, flash memories, filters, etc., and can be compatible with conventional substrates, such as with FBGA substrates. That is, based on the wafer-level ASIC 3D integrated substrate of the present disclosure, various packaging technologies such as System in a Package (SIP), Flip Chip Scale Package (FCCSP), Antenna-in-Package (AIP), Fan-out (FO) Package, etc. can be implemented.

The present disclosure further provides a packaging device, the packaging device includes a packaging chip and a wafer-level ASIC 3D integrated substrate as described in any of the above examples. The packaging chip is disposed on a surface of the wafer-level ASIC 3D integrated substrate and electrically connected to the wafer-level ASIC 3D integrated substrate. For more description of the wafer-level ASIC 3D integrated substrate, please refer to the preceding, which will not be repeated for the purpose of brevity. After preparing the wafer-level ASIC 3D integrated substrate, the packaging chip can be soldered to the front or back of the substrate through a bump 20 or pad on the packaging chip depending on the type of packaging chip according to the method for preparing the packaging device.

Figure 14:
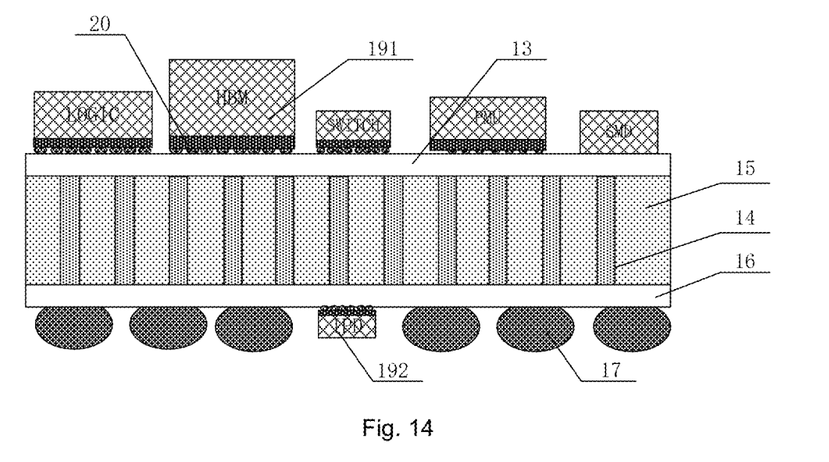
FIG. 14 shows a cross-sectional view of a packaging device according to an embodiment of the present disclosure.

In an embodiment, the packaging device includes an active device 191, a passive device 192, an inductor 25 and a capacitor 26. The active device 191 is disposed on the surface of the first wiring layer 13 away from the molding layer 15 and electrically connected to the first wiring layer 13. The Integrated Passive Device (IPD) is disposed on a surface of the second wiring layer 16 away from the molding layer 15 and is electrically connected to the second wiring layer 16. In further embodiments, referring to FIG. 14, the specific structures of the first wiring layer 13 and the second wiring layer 16 are not shown in FIG. 14 for brevity of illustration, the active device 191 includes one or more of a logic IC, an HBM, a switch, a PMU, and an SMD.

Figure 15:
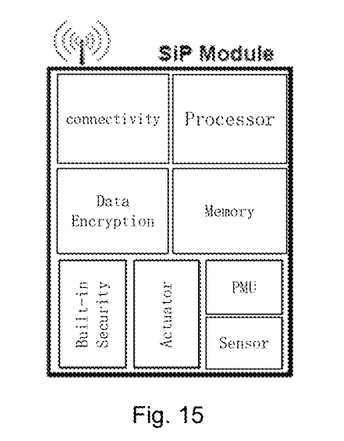
FIG. 15 shows a schematic top view of a packaging device according to the present disclosure.

As shown in FIG. 15, the packaging device may be a system-level Antenna-in-Package (AIP) module that can integrate a processor, a sensor, a data encryption chip, an actuator, a memory, a connector, a built-in security chip, and other devices. The devices can be arranged on the surface of the substrate, and an antenna and/or EMI shield may be formed on the surface of the packaging device.

Due to the aforementioned wafer-level ASIC 3D integrated substrate, the integration of the packaging device of the present disclosure is improved while the size of the packaging device is reduced, the cost is reduced, and the parasitic capacitance of the substrate is eliminated to reduce device noise. At the same time, the power efficiency is improved, and the response efficiency and reliability of the device is improved. The packaging device of the present disclosure has low requirements on design margin, which can further improve its applicability.

In summary, the present disclosure provides a wafer-level ASIC 3D integrated substrate, a packaging device and a preparation method. With the wafer-level ASIC 3D integrated substrate of the present disclosure, the minimum line width and line spacing of the wafer-level ASIC 3D integrated substrate of the present disclosure can be reduced to 1.5 µm, which is much smaller than 20 µm of that of the conventional substrate, thus enabling high-density and high-integration packaging of the device. The thickness of the substrate can be less than 0.2 mm (the thickness of the traditional FBGA 10-layer board is 1 mm), which helps to further reduce size of the packaging device. The time for fabricating the substrate is short, which can realize scale customization and help to reduce the package cost. The substrate does not need to be packaged with chips, which can reduce the risk of chip damage and help to improve the packaging yield. By using the wafer-level ASIC 3D integrated substrate of the present disclosure for packaging, various electronic chips and components such as millimeter wave antenna, capacitor, inductor, electric crystal switch, GPU, PMU, DDR, flash memory and filter can be integrated to realize system-level packaging. The packaging device packaged based on the wafer-level ASIC 3D integrated substrate of the present disclosure can not only reduce the cost, but also eliminate the parasitic capacitance of the substrate and reduce the device noise; meanwhile, it can improve the power efficiency and increase the device response efficiency and reliability; the requirement for the design margin of the device is low, which makes the packaging device of the present disclosure more widely applicable. Therefore, the disclosure effectively overcomes the shortcomings of the existing techniques and has a high industrial use value.

While particular elements, embodiments, and applications of the present disclosure have been shown and described, it is understood that the disclosure is not limited thereto because modifications may be made by those skilled in the art, particularly in light of the foregoing teaching. It is therefore contemplated by the appended claims to cover such modifications and incorporate those features which come within the spirit and scope of the disclosure.

What is claimed is:

1. A method for preparing a plurality of wafer-level ASIC 3D integrated substrates, comprising:
   providing a carrier;
   forming a separation layer on the carrier;
   forming a first wiring layer on the separation layer, wherein the first wiring layer comprises a first dielectric layer and a first metal wire layer, wherein the first metal wire layer is exposed from a top surface of the first dielectric layer;
   forming a conductive pillar on the first wiring layer, wherein the conductive pillar is electrically connected to the first metal wire layer;
   forming a molding layer, wherein the molding layer molds the conductive pillar, and wherein the conductive pillar is exposed from a top surface of the molding layer;
   forming a second wiring layer on the molding layer, wherein the second wiring layer comprises a second dielectric layer and a second metal wire layer, wherein the second metal wire layer is exposed from a top surface of the second dielectric layer, and wherein the second metal wire layer is electrically connected to the conductive pillar;
   forming solder balls on the second wiring layer, wherein the solder balls are electrically connected to the second metal wire layer; and
   peeling off the carrier at the separation layer to expose a surface of the first wiring layer away from the conductive pillar.

2. The method according to claim 1, wherein a thickness of the first wiring layer and a thickness of the second wiring layer each ranges from 15 µm to 40 µm, and a thickness of the molding layer ranges from 50 µm to 100 µm.

3. The method according to claim 1, wherein a material of the carrier comprises glass, and a material of the conductive pillar comprises copper.

4. The method according to claim 1, further comprising: forming an Organic Solderability Preservatives (OSP) antioxidant layer on the surface of the first wiring layer away from the conductive pillar before peeling off the carrier, wherein the OSP antioxidant layer covers a surface of the first metal wire layer.

5. The method according to claim 4, further comprising: separating the plurality of wafer-level ASIC 3D integrated substrates from each other by dicing after forming the OSP antioxidant layer.

* * * * *